United States Patent
Taniyama et al.

(10) Patent No.: US 11,997,889 B2
(45) Date of Patent: May 28, 2024

(54) DISPLAY DEVICE

(71) Applicant: SHARP KABUSHIKI KAISHA, Sakai (JP)

(72) Inventors: Hiroki Taniyama, Sakai (JP); Ryosuke Gunji, Sakai (JP); Shinsuke Saida, Sakai (JP); Shinji Ichikawa, Sakai (JP); Tohru Okabe, Sakai (JP); Kohji Ariga, Aioi (JP); Akira Inoue, Yonago (JP); Yoshihiro Kohara, Yonago (JP); Koji Tanimura, Yonago (JP); Yoshihiro Nakada, Yonago (JP); Hiroharu Jinmura, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 913 days.

(21) Appl. No.: 17/042,897

(22) PCT Filed: Mar. 30, 2018

(86) PCT No.: PCT/JP2018/013910
§ 371 (c)(1),
(2) Date: Sep. 28, 2020

(87) PCT Pub. No.: WO2019/187121
PCT Pub. Date: Oct. 3, 2019

(65) Prior Publication Data
US 2021/0098559 A1    Apr. 1, 2021

(51) Int. Cl.
*H10K 59/13* (2023.01)
*H10K 59/131* (2023.01)
*H10K 50/844* (2023.01)

(52) U.S. Cl.
CPC ......... *H10K 59/131* (2023.02); *H10K 50/844* (2023.02)

(58) Field of Classification Search
CPC .. H10K 59/131; H10K 50/844; H10K 59/873; H10K 59/8722; H10K 59/124; H05B 33/06; H05B 33/26; G09F 9/30
See application file for complete search history.

(56) References Cited

U.S. PATENT DOCUMENTS

| 2007/0120473 | A1 | 5/2007 | Nakamura et al. |
| 2014/0117330 | A1 | 5/2014 | Cho et al. |
| 2015/0091030 | A1 | 4/2015 | Lee et al. |
| 2015/0228927 | A1* | 8/2015 | Kim ............... H10K 50/805 257/40 |
| 2016/0204373 | A1 | 7/2016 | Park |

(Continued)

FOREIGN PATENT DOCUMENTS

| JP | 2007-164162 A | 6/2007 |
| JP | 2014-086415 A | 5/2014 |
| JP | 2017-168308 A | 9/2017 |

*Primary Examiner* — Mounir S Amer
*Assistant Examiner* — Alexander Belousov
(74) *Attorney, Agent, or Firm* — ScienBiziP, P.C.

(57) ABSTRACT

Frame wiring lines are provided in a frame region, a flattening film in which a frame-shaped slit is formed in the frame region is provided in the display region and the frame region, a plurality of first electrodes constituting light-emitting elements are provided on the flattening film, and conductive layer made of the same material and formed in the same layer as those of each of the plurality of first electrodes are provided covering at least end faces of the frame wiring lines exposed from the slit.

11 Claims, 10 Drawing Sheets

(56) References Cited

U.S. PATENT DOCUMENTS

| | | | |
|---|---|---|---|
| 2017/0125505 A1 | 5/2017 | Oh | |
| 2017/0194413 A1* | 7/2017 | Nagasawa | H05B 33/26 |
| 2017/0271423 A1* | 9/2017 | Murai | H10K 59/131 |
| 2017/0373128 A1 | 12/2017 | Lee et al. | |
| 2019/0206964 A1* | 7/2019 | Murai | H10K 59/131 |
| 2019/0319214 A1* | 10/2019 | Taniyama | H10K 50/8445 |
| 2019/0326549 A1* | 10/2019 | Kokame | H05B 33/06 |
| 2020/0152910 A1* | 5/2020 | Okabe | G09F 9/00 |
| 2020/0185644 A1* | 6/2020 | Ohta | H10K 71/00 |
| 2021/0005842 A1* | 1/2021 | Takahashi | G09F 9/30 |
| 2021/0013296 A1* | 1/2021 | Ochi | H10K 59/131 |
| 2021/0020728 A1* | 1/2021 | Saitoh | H10K 59/131 |
| 2021/0020732 A1* | 1/2021 | Watanabe | G09F 9/30 |
| 2021/0057511 A1* | 2/2021 | Saitoh | G09F 9/00 |
| 2021/0091339 A1* | 3/2021 | Kishimoto | H10K 59/1201 |
| 2021/0091345 A1* | 3/2021 | Kishimoto | H05B 33/04 |
| 2021/0098553 A1* | 4/2021 | Yamanaka | H05B 33/02 |
| 2021/0098559 A1* | 4/2021 | Taniyama | G09F 9/30 |
| 2021/0135159 A1* | 5/2021 | Senoo | H10K 71/00 |
| 2021/0288286 A1* | 9/2021 | Okabe | H05B 33/10 |
| 2021/0351263 A1* | 11/2021 | Okabe | H10K 59/8731 |
| 2022/0005887 A1* | 1/2022 | Saitoh | H10K 59/88 |
| 2022/0005918 A1* | 1/2022 | Murai | H10K 50/844 |
| 2022/0006049 A1* | 1/2022 | Sakamoto | G09F 9/30 |
| 2022/0115475 A1* | 4/2022 | Gunji | H10K 59/124 |
| 2022/0190075 A1* | 6/2022 | Murakami | H01L 25/18 |
| 2022/0415997 A1* | 12/2022 | Okabe | H05B 33/26 |
| 2023/0077957 A1* | 3/2023 | Okabe | H10K 59/124 257/40 |
| 2024/0023384 A1* | 1/2024 | Okabe | H10K 59/124 |

\* cited by examiner

DISPLAY DEVICE

TECHNICAL FIELD

The disclosure relates to a display device.

BACKGROUND ART

In recent years, organic electroluminescence (EL) display devices, which use organic EL elements and are of the self-luminous type, have attracted attention as a display device that can replace the liquid crystal display device. For the organic EL display device, a seal structure is proposed to suppress degradation of the organic EL element due to penetration of, for example, moisture and oxygen. The seal structure includes a sealing film covering the organic EL element, and the sealing film includes a layered film of an inorganic film and an organic film.

For example, PTL 1 discloses a display device including a thin film sealing layer. The thin film sealing layer has a layered structure in which an inorganic film layer formed through chemical vapor deposition (CVD) or the like, and an organic film layer formed through an ink-jet method or the like, are disposed in an alternating manner, and the thin film sealing layer covers an organic light-emitting element.

CITATION LIST

Patent Literature

PTL 1: JP 2014-86415 A

SUMMARY

Technical Problem

In the case of forming the organic sealing film formed through the ink-jet method, as in the display device disclosed in PTL 1, a barrier wall configured to dam ink serving as an organic film needs to be provided in a frame region around a display region provided with an organic EL element. The organic EL display device includes, for example, a resin substrate, a thin film transistor (TFT) layer provided on the resin substrate, and an organic EL element provided on the TFT layer. Here, the TFT layer includes frame wiring lines provided in a frame region, and a flattening film that is provided on the frame wiring lines and includes a flat surface in a display region. The organic EL element includes a plurality of first electrodes, an edge cover, a plurality of organic EL layers, and second electrodes, which are provided over the flattening film in the order stated. In the case where the dam wall and the flattening film are made of the same material and provided in the same layer, the frame wiring lines are damaged from the etching solution used in forming the first electrodes and the developing solution used in forming the edge cover, and thus the edge of the cross-section of the frame wiring line is formed in an overhanging shape, for example. And hence, the sealing performance of the sealing film formed on the frame wiring lines may be reduced, deteriorating the organic EL element.

The disclosure is devised in light of this situation, and an object of the disclosure is to suppress a damage of frame wiring lines during a manufacturing process.

Solution to Problem

In order to achieve the object described above, a display device according to the disclosure includes a base substrate, a TFT layer provided on the base substrate, a light-emitting element provided on the TFT layer, the light-emitting element constituting a display region, a frame region provided in the periphery of the display region, a terminal portion provided at an edge of the frame region extending in one direction, a frame wiring line constituting the TFT layer, the frame wiring line being provided in the frame region, a flattening film constituting the TFT layer, the flattening film being provided in the display region and the frame region, and formed with a frame-shaped slit in the frame region, a plurality of first electrodes constituting the light-emitting element, the plurality of first electrodes being provided on the flattening film, and a second electrode constituting the light-emitting element, the second electrode being provided above each of the plurality of first electrodes by interposing a light-emitting layer. A conductive layer made of the same material with each of the plurality of first electrodes and formed in the same layer with each of the plurality of first electrodes is provided covering at least an end face of the frame wiring line exposed from the slit.

Advantageous Effects of Disclosure

According to the disclosure, since the conductive layer made of the same material and formed in the same layer as those of each first electrode is provided to cover at least the end face of the frame wiring line exposed from the slit, damage on the frame wiring line during the manufacturing process can be suppressed.

DESCRIPTION OF EMBODIMENTS

Embodiments of the disclosure will be described below in detail with reference to the drawings. The disclosure is not limited to the embodiments described below.

First Embodiment

Figure 1:
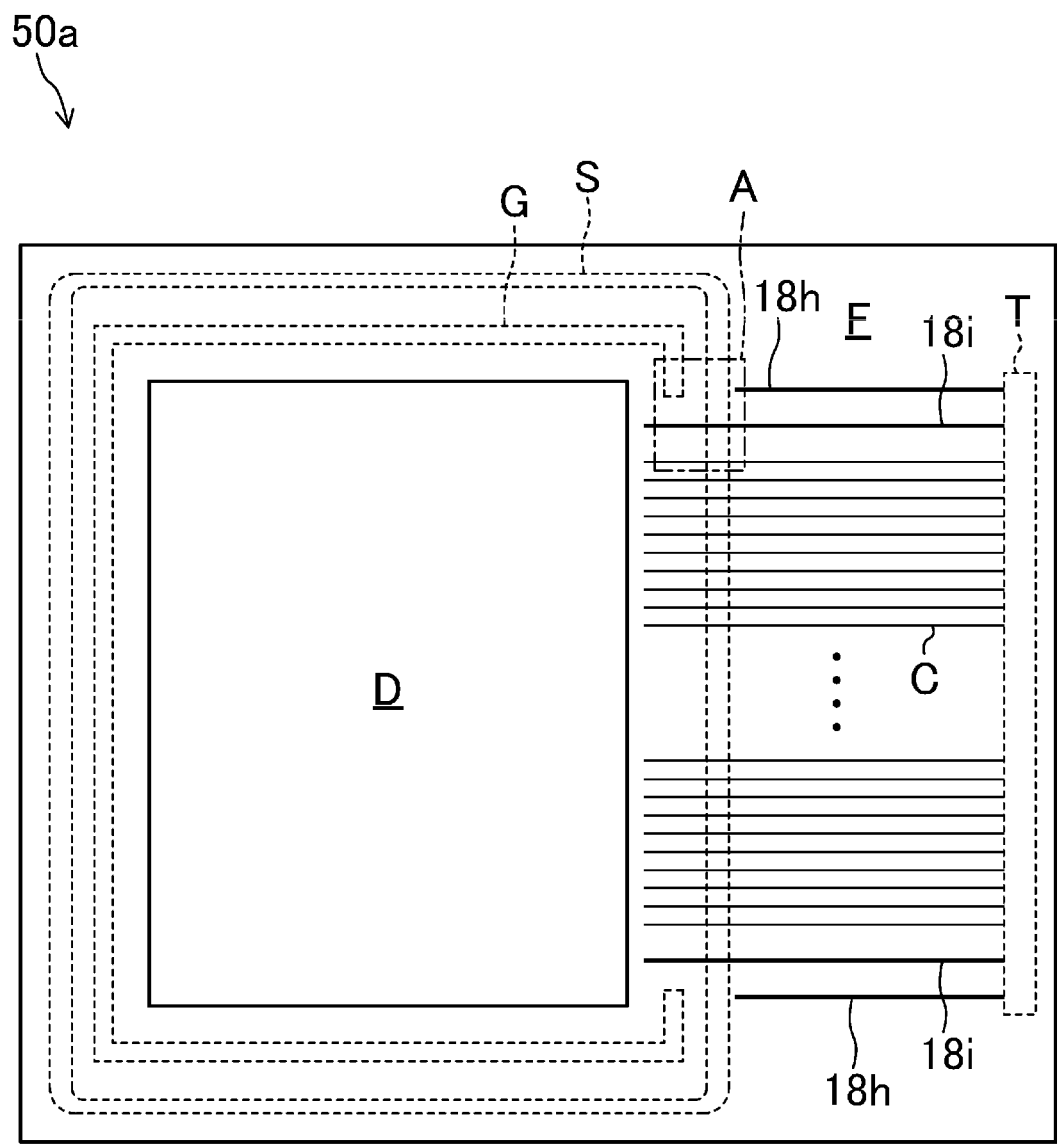
FIG. 1 is a plan view illustrating an overall configuration of an organic EL display device according to a first embodiment of the disclosure.
Figure 2:
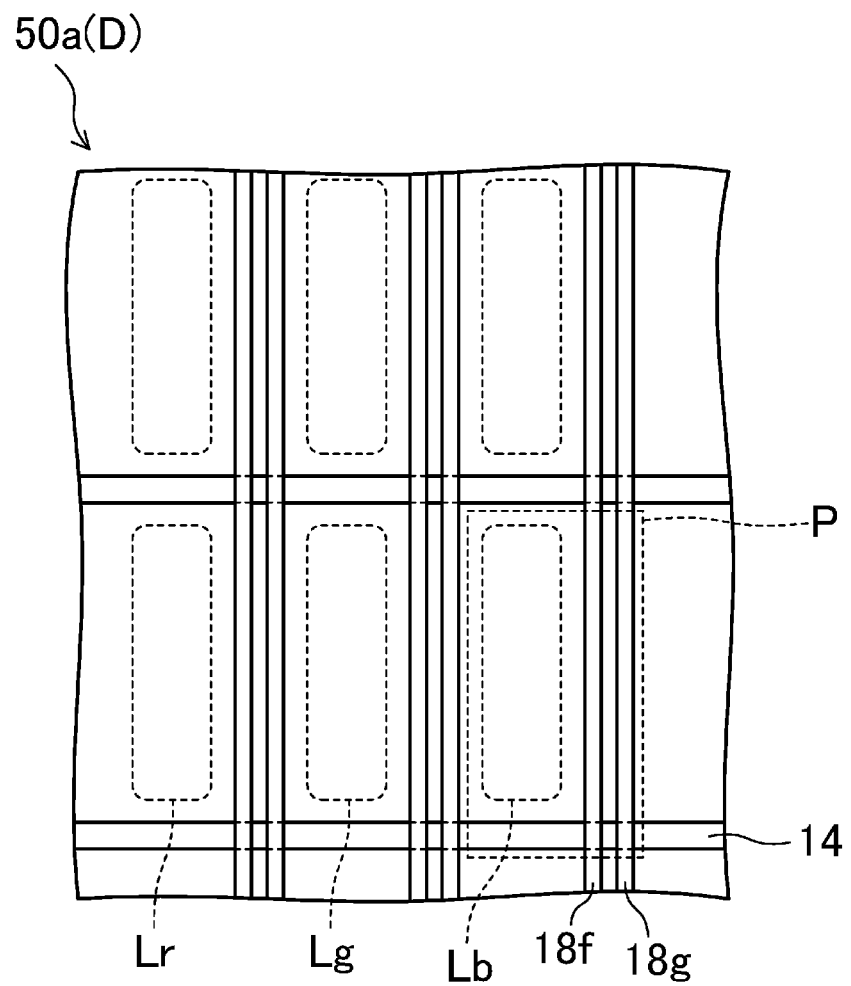
FIG. 2 is a plan view of a display region of the organic EL display device according to the first embodiment of the disclosure.
Figure 3:
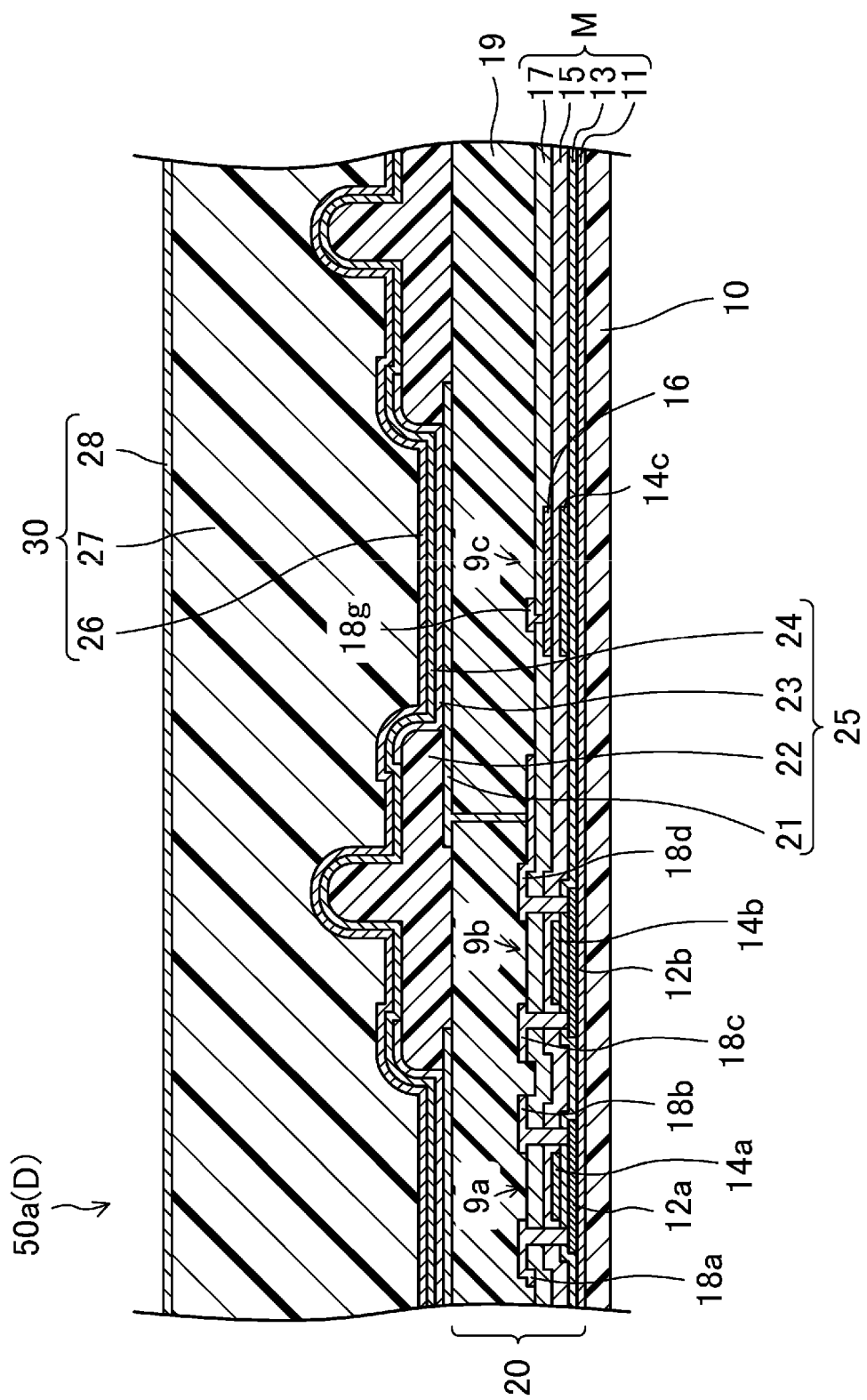
FIG. 3 is a cross-sectional view of the display region of the organic EL display device according to the first embodiment of the disclosure.
Figure 4:
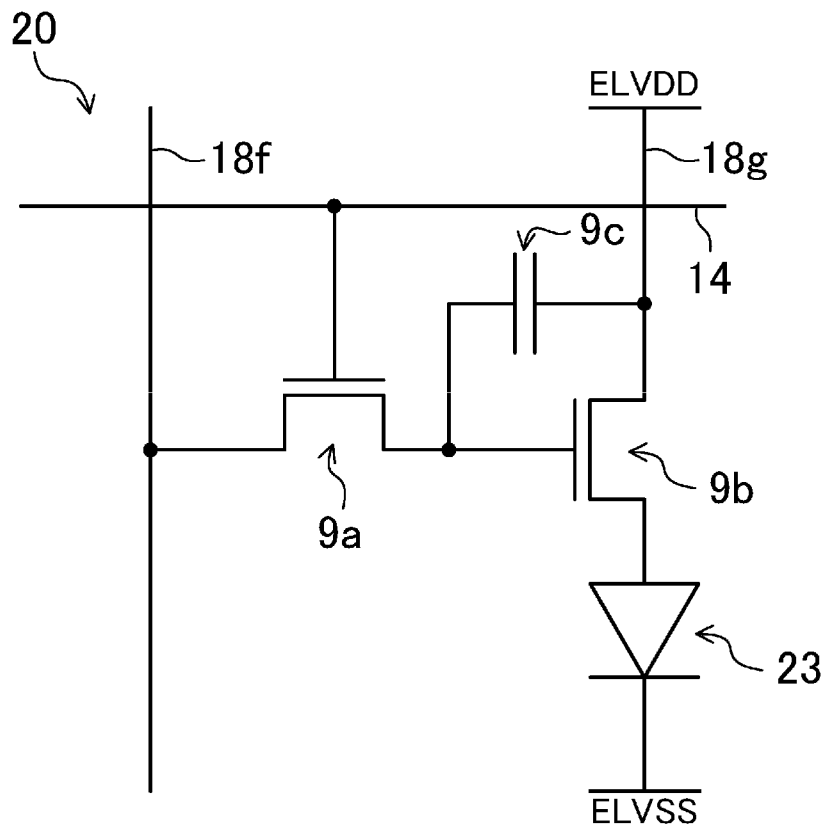
FIG. 4 is an equivalent circuit diagram illustrating a TFT layer constituting the organic EL display device according to the first embodiment of the disclosure.
Figure 5:
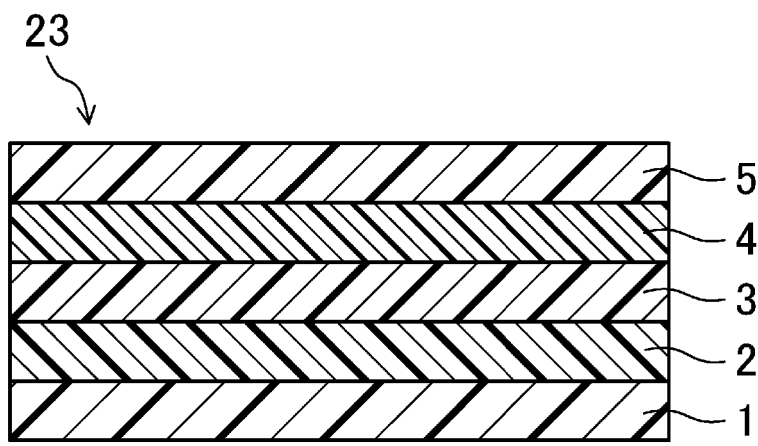
FIG. 5 is a cross-sectional view illustrating an organic EL layer constituting the organic EL display device according to the first embodiment of the disclosure.
Figure 6:
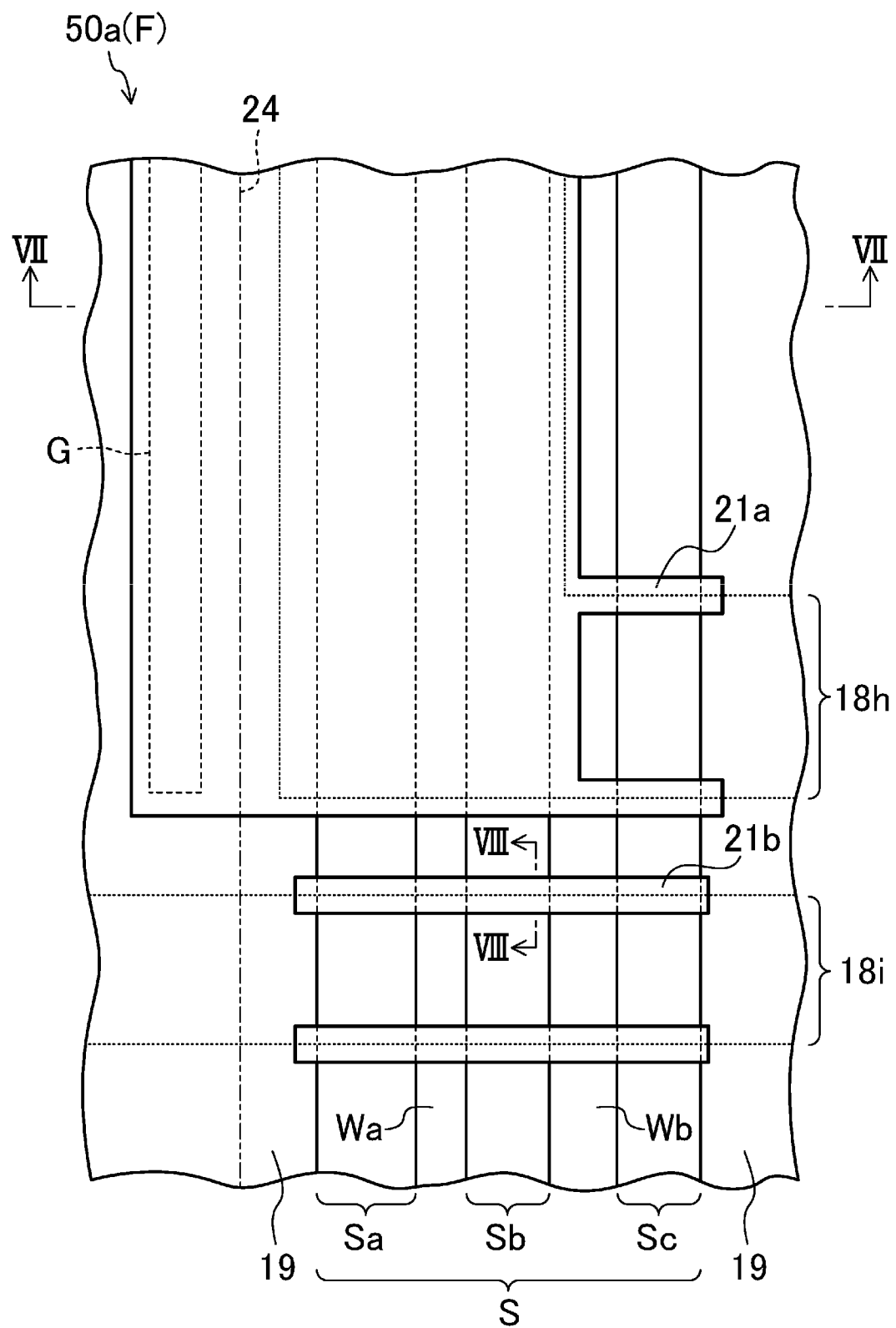
FIG. 6 is a plan view of an enlarged main portion of a region A in FIG. 1.
Figure 7:
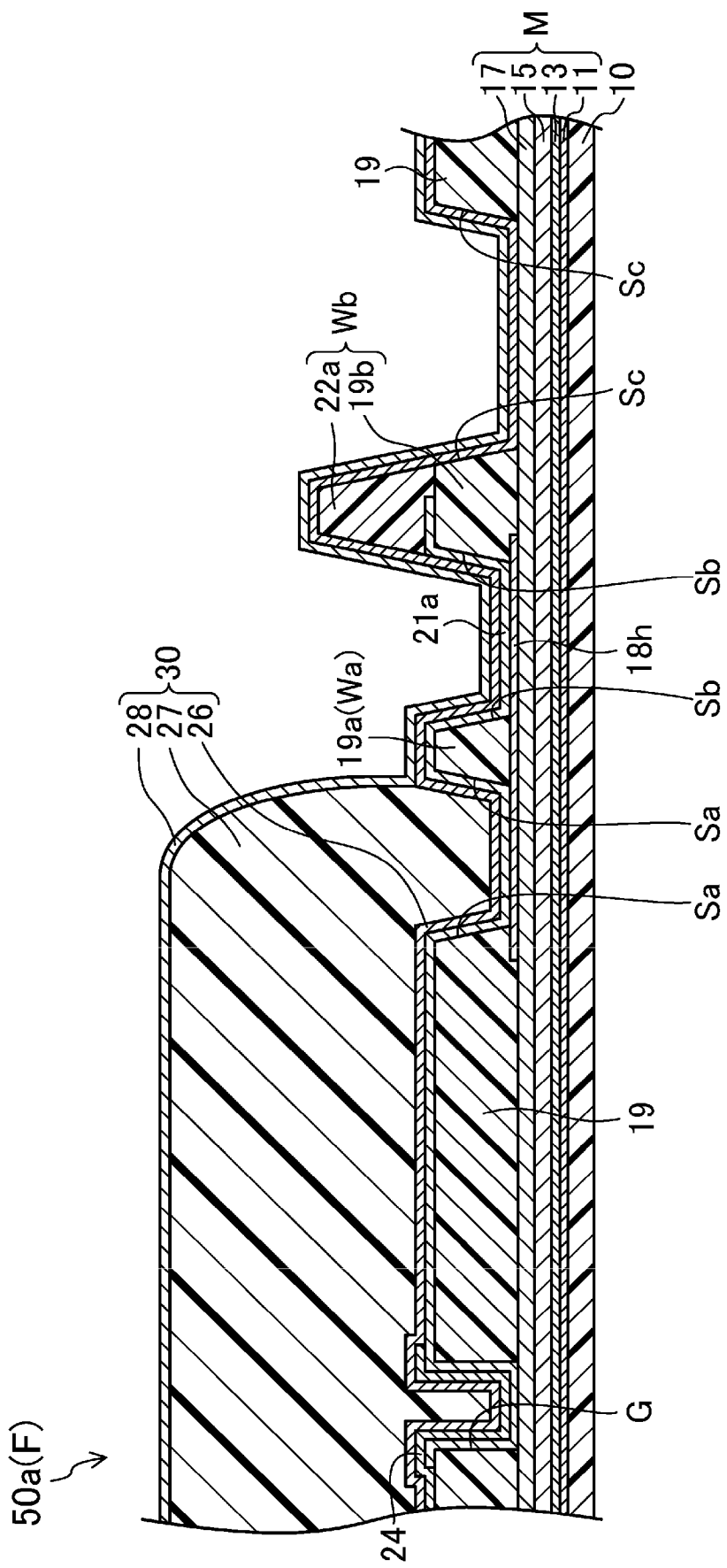
FIG. 7 is a cross-sectional view of a frame region of the organic EL display device taken along a line VII-VII in FIG. 6.
Figure 8:
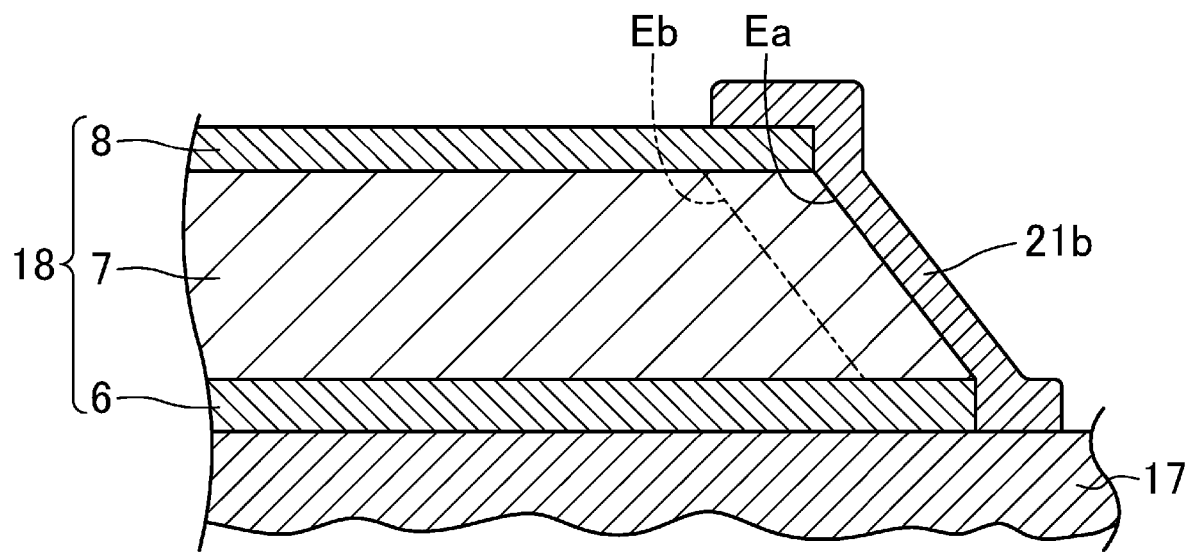
FIG. 8 is a cross-sectional view of the frame region of the organic EL display device taken along the line VIII-VIII in FIG. 6 during a manufacturing process.

FIGS. 1 to 8 illustrate a first embodiment of a display device according to the disclosure. Note that, in each of the following embodiments, an organic EL display device including an organic EL element will be exemplified as a display device including a light-emitting element. Here, FIG. 1 is a plan view illustrating an overall configuration of an organic EL display device 50a according to the present embodiment. FIG. 2 is a plan view of a display region D of the organic EL display device 50a. FIG. 3 is a cross-sectional view of the display region D of the organic EL display device 50a. FIG. 4 is an equivalent circuit diagram illustrating a TFT layer 20 constituting the organic EL display device 50a. FIG. 5 is a cross-sectional view illustrating an organic EL layer 23 constituting the organic EL display device 50a. FIG. 6 is a plan view of an enlarged main portion of a region A in FIG. 1. FIG. 7 is a cross-sectional view of a frame region F of the organic EL display device 50a taken along a line VII-VII in FIG. 6. FIG. 8 is a cross-sectional view of the frame region F of the organic EL display device 50a taken along the line VIII-VIII in FIG. 6.

As illustrated in FIG. 1, the organic EL display device 50a includes, for example, the display region D that is provided to be a rectangular shape is configured to display an image, and the frame region F provided in the periphery of the display region D.

As illustrated in HG. 2, a plurality of subpixels P are arranged in a matrix shape in the display region D. In the display region D, as illustrated in FIG. 2, for example, a subpixel P including a red light-emitting region Lr configured to display red color, a subpixel P including a green light-emitting region Lg configured to display a green color, and a subpixel P including a blue light-emitting region Lb configured to display blue color are provided adjacent to one another. In the display region D, for example, three adjacent subpixels P including the red light-emitting region Lr, the green light-emitting region Lg, and the blue light-emitting region Lb constitute one pixel.

The terminal region T extending in one direction (the vertical direction in FIG. 1) is provided in the right edge of the frame region F in FIG. 1. In the frame region F, a frame-shaped slit S is formed in a flattening film 19 described below so as to surround the display region D, as illustrated in FIG. 1. Furthermore, in the frame region F, as illustrated in FIG. 1, a substantially C-shaped trench G is formed in the flattening film 19 between the slit S and the display region D. Here, as illustrated in FIG. 1, the trench G is formed in a substantially C-like shape so as to open a side of the terminal portion T in plan view.

As illustrated in FIG. 3, the organic EL display device 50a includes, in the display region D, a resin substrate layer 10 provided as a base substrate, a TFT layer 20 provided on the resin substrate layer 10, an organic EL element 25 provided as a light-emitting element constituting the display region D on the TFT layer 20, and a sealing film 30 that covers the organic EL element 25.

The resin substrate layer 10 is formed of a polyimide resin or the like, for example.

As illustrated in FIG. 3, the TFT layer 20 includes a base coat film 11 provided on the resin substrate layer 10, a plurality of first TFTs 9a, a plurality of second TFTs 9b and a plurality of capacitors 9c, which are provided on the base coat film 11, and a flattening film 19 provided on each of the first TFTs 9a, the second TFTs 9b, and the capacitors 9c. Here, in the TFT layer 20, as illustrated in FIGS. 2 and 4, a plurality of gate lines 14 are provided so as to extend parallel to each other in a horizontal direction in the figures. In the TFT layer 20, as illustrated in FIGS. 2 and 4, a plurality of source lines 18f are provided so as to extend parallel to each other in a vertical direction in the figures. In the TFT layer 20, as illustrated in FIGS. 2 and 4, a plurality of power source lines 18g are provided so as to extend parallel to each other in a vertical direction in the figures, Note that, as illustrated in FIG. 2, each of the power source lines 18g are provided adjacent to the respective source lines 18f. In the TFT layer 20, as illustrated in FIG. 4, each subpixel P includes the first TFT 9a, the second TFT 9b, and the capacitor 9c.

The base coat film 11 is made up of a single-layer film or a layered film of an inorganic insulating film of, for example, silicon nitride, silicon oxide, silicon oxide nitride, or the like.

As illustrated in FIG. 4, the first TFT 9a is electrically connected to the corresponding gate line 14 and source line 18f in each subpixel P. In addition, as illustrated in FIG. 3, the first TFT 9a includes a semiconductor layer 12a, a gate insulating film 13, a gate electrode 14a, a first interlayer insulating film 15, a second interlayer insulating film 17, a source electrode 18a, and a drain electrode 18b, which are provided on the base coat film 11 in this order stated. Here, as illustrated in FIG. 3, the semiconductor layer 12a is provided in an island shape on the base coat film 11, and includes a channel region, a source region, and a drain region, as described below. As illustrated in FIG. 3, the gate insulating film 13 is provided to cover the semiconductor layer 12a. As illustrated in FIG. 3, the gate electrode 14a is provided on the gate insulating film 13 so as to overlap with the channel region of the semiconductor layer 12a. As illustrated in FIG. 3, the first interlayer insulating film 15 and the second interlayer insulating film 17 are provided in this order to cover the gate electrode 14a. As illustrated in FIG. 3, the source electrode 18a and the drain electrode 18b are provided so as to be separated from each other on the second interlayer insulating film 17. As illustrated in FIG. 3, the source electrode 18a and the drain electrode 18b are electrically connected to the source region and the drain region of the semiconductor layer 12a, respectively, by interposing each contact hole formed in a layered film constituted of the gate insulating film 13, the first interlayer insulating film 15, and the second interlayer insulating film 17. The gate insulating film 13, the first interlayer insulating film 15 and the second interlayer insulating film 17 are made up of a single-layer film or a layered film of an inorganic insulating film of, for example, silicon nitride, silicon oxide, silicon oxynitride, or the like.

As illustrated in FIG. 4, the second TFT 9b is electrically connected to the corresponding first TFT 9a and power source line 18g in each subpixel P. In addition, as illustrated in FIG. 3, the first TFT 9b includes a semiconductor layer 12b, the gate insulating film 13, a gate electrode 14b, the first interlayer insulating film 15, the second interlayer insulating film 17, a source electrode 18c, and a drain electrode 18d, which are provided on the base coat film 11 in this order stated. Here, as illustrated in FIG. 3, the semiconductor layer 12b is provided in an island shape on the base coat film 11, and like the semiconductor layer 12a, includes a channel region, a source region, and a drain region. As illustrated in FIG. 3, the gate insulating film 13 is provided to cover the semiconductor layer 12b. As illustrated in FIG. 3, the gate electrode 14b is provided on the gate insulating film 13 so as to overlap with the channel region of the semiconductor layer 12b. As illustrated in FIG. 3, the first interlayer insulating film 15 and the second interlayer insulating film 17 are provided in this order to cover the gate electrode 14b. As illustrated in FIG. 3, the source electrode 18c and the drain electrode 18d are provided so as to be separated from each other on the second interlayer insulating film 17. As illustrated in FIG. 3, the source electrode 18c and the drain electrode 18d are electrically connected to the source region and the drain region of the semiconductor layer 12b, respectively, by interposing each contact hole formed in layered films of the gate insulating film 13, the first interlayer insulating film 15, and the second interlayer insulating film 17.

In this embodiment, the first TFT 9a and the second TFT 9b are exemplified as being of a top-gate type and however, the first TFT 9a and the second TFT 9b may be a bottom-gate type TFT.

The capacitor 9c is electrically connected to the corresponding first TFT 9a and power source line 18g in each subpixel P as illustrated in FIG. 4. The capacitor 9c includes, as illustrated in FIG. 3, a lower conductive layer 14c formed of the same material and in the same layer as those of the gate electrode 14a and the like, the first interlayer insulating film 15 provided so as to cover the lower conductive layer 14c, and an upper conductive layer 16 provided on the first interlayer insulating film 15 so as to overlap the lower conductive layer 14c. As illustrated in FIG. 3, the upper conductive layer 16 is electrically connected to the power source line 18g by interposing the contact hole formed in the second interlayer insulating film 17.

The flattening film 19 includes a flat surface in the display region D, and is formed of an organic resin material such as a polyimide resin. Note that the flattening film 19 made of polyimide resin is exemplified in the present embodiment, but the flattening film 19 may be formed from an organic resin material such as an acrylic resin, a polysiloxane resin, or the like.

As illustrated in FIG. 3, the organic EL element 25 includes, a plurality of first electrodes 21, an edge cover 22, a plurality of organic EL layers 23, and a second electrode 24, which are provided on the TFT layer 20 in the order stated.

As illustrated in FIG. 3, the plurality of first electrodes 21 are provided as anode electrodes in a matrix shape on the TFT flattening film 19 so as to correspond to the plurality of subpixels P. As illustrated in FIG. 3, the first electrode 21 is electrically connected to the drain electrode 18d of each second TFT 9b by interposing the contact hole formed in the flattening film 19. The first electrode 21 functions to inject holes (positive holes) into the organic EL layer 23. The first electrode 21 is preferably formed of a material having a large work function to improve the efficiency of hole injection into the organic EL layer 23. Examples of the first electrode 21 include metallic materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). The material forming the first electrode 21 may be an alloy such as astatine (At)/astatine oxide ($AtO_2$). For materials constituting the first electrode 21, there may be adopted electrically conductive oxides, as examples, such as tin oxide (SnO), zinc oxide (ZnO), indium tin oxide (ITO), and indium zinc oxide (IZO). The first electrode 21 may be formed by layering a plurality of layers formed of any of the materials described above. Note that, examples of compound materials having a large work function include indium tin oxide (ITO) and indium zinc oxide (IZO).

As illustrated in FIG. 3, the edge cover 22 is provided in a lattice pattern so as to cover the circumferential edge portion of each first electrode 21. For materials forming the edge cover 22, there are raised organic films of, for example, polyimide resin, acrylic resin, and polysiloxane resin.

As illustrated in FIG. 3, the plurality of organic EL layers 23 are respectively disposed on the first electrodes 21 and are provided as light-emitting layers in a matrix shape so as to correspond to the plurality of subpixels. As illustrated in FIG. 5, each organic EL layer 23 includes a hole injection layer 1, a hole transport layer 2, a light-emitting layer body 3, an electron transport layer 4, and an electron injection layer 5, which are provided on the first electrode 21 in the order stated.

The hole injection layer 1 is also referred to as an anode electrode buffer layer, and functions to reduce an energy level difference between the first electrode 21 and the organic EL layer 23 to thereby improve the efficiency of hole injection into the organic EL layer 23 from the first electrode 21. Examples of materials that may be included in the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 21 to the organic EL layer 23. Here, examples of materials that may be included in the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer body 3 is a region where, at application of a voltage via the first electrode 21 and the second electrode 24, holes and electrons are respectively injected from the first electrode 21 and the second electrode 24, and the holes and the electrons recombine. The light-emitting layer body 3 is formed of a material having high light-emitting efficiency. Examples of the materials forming the light-emitting layer body 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate moving of electrons to the light-emitting layer body 3 efficiently. Examples of materials constituting the electron transport layer 4 include oxadiazole derivative, triazole derivative, benzoquinone derivative, naphthoquinone derivative, anthraquinone derivative, tetracyanoanthraquinodimethane derivative, diphenoquinone derivative, fluorenone derivative, silole derivative, and metal oxinoid compound, as organic compounds.

The electron injection layer 5 functions to reduce an energy level difference between the second electrode 24 and the organic EL layer 23, thereby improving the efficiency of electron injection into the organic EL layer 23 from the second electrode 24, and the electron injection layer 5 can lower the drive voltage of the organic EL element 25 by this function. Note that the electron injection layer 5 is also referred to as a cathode buffer layer. Here, examples of materials forming the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$); aluminum oxide ($Al_2O_3$), and strontium oxide (SrO).

As illustrated in FIG. 3, the second electrode 24 is provided as a cathode electrode to cover each organic EL layer 23 and the edge cover 22. The second electrode 24 functions to inject electrons into the organic EL layer 23. The second electrode 24 is preferably formed of a material having a small work function to improve the efficiency of electron injection into the organic EL layer 23. For materials constituting the second electrode 24 include, for example, silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). The second electrode 24 may be formed of alloys of magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al), for example, The second electrode 24 may be formed of an electrically conductive oxide such as tin oxide (SnO), zinc oxide (ZnO), indium tin oxide (ITO), and indium zinc oxide (ILO). The second electrode 24 may be formed by layering a plurality of layers of any of the materials described above. Note that, examples of materials having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (Lin/calcium (Ca)/aluminum (Al).

As illustrated in FIG. 3, the sealing film 30 is provided so as to cover the second electrode 24, includes, a first inorganic film 26, an organic film 27, and a second inorganic film 28, which are layered over the second electrode 24 in the order stated, and functions to protect the organic EL layer 23 of the organic EL element 25 from moisture and oxygen.

The first inorganic film 26 and the second inorganic film 28 are constituted of an inorganic insulating film such as a silicon nitride film, a silicon oxide film, a silicon oxynitride film, or the like.

The organic film 27 is constituted of an organic resin material such as an acrylic resin, an epoxy resin, a silicone resin, a polyurea resin, a parylene resin, a polyimide resin, a polyamide resin.

As illustrated in FIGS. 6 and 7, the organic EL display device 50a includes, in the frame region F, a resin substrate layer 10, an inorganic insulating layered film M provided on the resin substrate layer 10, and frame wiring lines provided on the inorganic insulating layered film M, that is, first frame wiring lines 18h and second frame wiring lines 18i, a flattening film 19 provided on the first frame wiring lines 18h and the second frame wiring lines 18i, a first dam wall Wa, a second dam wall Wb, and a sealing film 30 provided to cover the flattening film 19, the first dam wall Wa, and the second dam wall Wb. Note that, in the plan view of FIG. 6, the sealing film 30 disposed on the entire face of the drawing is omitted.

As illustrated in FIG. 7, the inorganic insulating layered film NI includes the base coat film 11, the gate insulating film 13, the first interlayer insulating film 15, and the second interlayer insulating film 17, which are provided on the resin substrate layer 10 in the order stated.

As illustrated in FIG. 1, one ends (right ends in the drawing) of a pair of the first frame wiring lines 18h are provided so as to reach both edges of the terminal portion T. As illustrated in FIGS. 6 and 7, each of the other ends (left ends in FIG. 1) of the first frame wiring lines 18h are provided so as to reach the interior of the slit S. Each of the first frame wiring lines 18h receives an input of a low power supply voltage, and as illustrated in FIG. 7, is electrically connected to the conductive layer 21a by interposing a first slit Sa and a second slit Sb. Furthermore, as illustrated in FIG. 7, the conductive layer 21a is electrically connected to the second electrode 24 by interposing the trench G. That is, each of the first frame wiring lines 18h to which the low power supply voltage is input is electrically connected to the second electrode 24. The first frame wiring lines 18h and the source electrode 18a and the like are made of the same material and provided in the same layer. Note that, in the present embodiment, as described below, the first frame wiring line 18h that is formed of by a layered film in which a titanium film, an aluminum film, and a titanium film are layered in the order stated is exemplified, but the first frame wiring line 18h may use a high melting-point metal film such as molybdenum, tantalum, tungsten, or the like, instead of the titanium film. The conductive layer 21a and the first electrode 21 are provided in the same layer and are made of the same material. For example, a TFT or the like (not illustrated) constituting a gate driver circuit is provided on each of both sides (upper side and lower side in the drawing) of the upper side portion and the lower side portion of the trench G in FIG. 1.

As illustrated in FIG. 1, one ends (right ends in the drawing) of a pair of the second frame wiring lines 18i are provided so as to reach both edges of the terminal portion T. The second frame wiring lines 18i each receive a high power supply voltage, and as illustrated in FIG. 6, and cross the slit S at the other ends (left ends in FIG. 1) to become a high power supply voltage trunk wiring line (not illustrated) formed between the first slit Sa and the display region D. This high power supply voltage trunk wiring line is provided in the frame region F along the side of the display region D in a direction orthogonal to the source line 18f and the power source line 18g. The high power supply voltage trunk wiring line branches into a plurality of branches on the side of the display region and the branched portions are electrically connected to the plurality of power source lines 18g disposed in the display region D. Note that, as illustrated in the second embodiment described below, the second frame wiring line 18*j* itself may constitute a high power supply voltage trunk wiring line. The second frame wiring lines 18*i* and the source electrode 18*a* and the like are provided in the same layer and made of the same material.

Note that a plurality of lead wiring lines C made of the same material and formed in the same layer as those of the gate electrode 14*a*, the upper conductive layer 16, or the source electrode 18*a* are provided as other frame wiring lines between the pair of second frame wiring lines 18*i* so as to extend parallel to each other in a direction orthogonal to the direction in which the terminal portion extends (the lateral direction in FIG. 1). Here, one edges (left edges in FIG. 1) of the lead wiring lines C are electrically connected to display wiring lines (the gate line 14, the source line 18*f*, and the like) provided in the display region D. The other ends (right edges in FIG. 1) of the lead wiring lines C are provided to reach the terminal portion T.

As illustrated in FIGS. 6 and 7, the first dam wall Wa is provided in a frame shape on the side of the display region D within the slit S, and is configured to suppress the spreading of the organic film 27 of the sealing film 30. Here, as illustrated in FIG. 7, the first dam wall Wa is constituted of a first resin layer 19*a* made of the same material and formed in the same layer as those of the flattening film 19.

As illustrated in FIGS. 6 and 7, the second dam wall Wb is provided in a frame shape so as to surround the first dam wall Wa inside the slit, and is configured to suppress the spreading of the organic film 27 of the sealing film 30. Here, as illustrated in FIG. 7, the second dam wall Wb is constituted of a second resin layer 19*b* made of the same material and formed in the same layer as those of the flattening film 19, and a third resin layer 22*a* that is provided on the second resin layer 19*b* made of the same material and formed in the same layer as those of the edge cover 22. As illustrated in FIGS. 6 and 7, the slit S includes the first slit Sa disposed between the flattening film 19 and the first dam wall Wa on the side of the display region D, the second slit Sb disposed between the first dam wall Wa and the second dam wall Wb, and a third slit Sc disposed between the flattening film 19 and the second dam wall Wb on the opposite side to the display region D (on the side of the terminal portion T).

As illustrated in FIG. 6, the conductive layer 21*a* is provided on the edges of the first frame wiring lines 18*h* exposed from the first slit Sa, the second slit Sb, and the third slit Sc, so as to cover the exposed end faces of the first frame wiring lines 18*h*. As illustrated in FIG. 6 and FIG. 7, a conductive layer 21*b* is provided on the edge of the second frame wiring lines 18*i* exposed from the first slit Sa, the second slit Sb, and the third slit Sc, so as to cover the exposed end face of the second frame wiring line 18*i*. The conductive layer 21*b* and the first electrode 21 are provided in the same layer and are made of the same material.

As illustrated in FIG. 7, the organic film 27 of the sealing film 30 is provided in the frame region F to the side surface of the first dam wall Wa on the left side in the drawing by interposing the first inorganic film 26. Here, on the upper face of the second dam wall Wb, the first inorganic film 26 and the second inorganic film 28 of the sealing film 30 are in contact with each other. Note that in the present embodiment, a configuration in which the organic film 27 that is dammed on the side face of the first dam wall Wa on the side of the display region D side is exemplified, but the organic film 27 may reach the upper face of the second dam wall Wb, for example. Additionally, as illustrated in FIG. 7, the conductive layer 21*a* is in contact with the first inorganic film 26 inside the first slit Sa and the second slit Sb.

In the organic EL display device 50*a* described heretofore, in each subpixel P, a gate signal is inputted into the first TFT 9*a* via the gate line 14 to thereby turn on the first TFT 9*a*, a predetermined voltage corresponding to a source signal is written in the gate electrode 14*b* of the second TFT 9*b* and the capacitor 9*c* via the source line 18*f*, the magnitude of current from the power source line 18*g* is specified based on a gate voltage of the second TFT 9*b*, and the specified current is supplied to the organic EL layer 23, whereby the light-emitting layer body 3 of the organic EL layer 23 emits light to display an image. In the organic EL display device 50*a*, since even when the first TFT 9*a* is turned off, the gate voltage of the second TFT 9*b* is held by the capacitor 9*c*, the light-emitting layer body 3 is kept emitting light until a gate signal of the next frame is inputted.

A method of manufacturing the organic EL display device 50*a* according to the present embodiment will be described next. Note that the method of manufacturing the organic EL display device 50*a* according to the present embodiment includes forming a TFT layer, forming an organic EL element and forming a sealing film.

Forming TFT Layer

For example, the base coat film 11, the first TFT 9*a*, the second TFT 9*b*, the capacitor 9*c*, and the flattening film 19 are formed on the surface of the resin substrate layer 10 formed on a glass substrate using any known method, to form the TFT layer 20.

Here, when forming the source electrode 18*a* and the drain electrode 18*b* of the first TFT 9*a* and the source electrode 18*c* and the drain electrode 18*d* of the second TFT 9*b*, the first frame wiring line 18*h* and the second frame wiring line 18*i* are simultaneously formed in the frame region F. Furthermore, when forming the flattening film 19 on the first TFT 9*a*, the second TFT 9*b*, the first frame wiring line 18*h*, and the second frame wiring line 18*i*, the first dam wall Wa (the first resin layer 19*a*) and the lower layer of the second dam wall Wb (the second resin layer 19*b*) are simultaneously formed in the frame region F.

Forming Organic EL Element

The first electrode 21, the edge cover 22, the organic EL layer 23 (the hole injection layer 1, the hole transport layer 2, the light-emitting layer body 3, the electron transport layer 4, and the electron injection layer 5), the second electrode 24 are formed on the flattening film 19 of the TFT layer 20 formed in the forming TFT layer by any known method to form the organic EL element 25.

Here, when forming the first electrode 21, the conductive layers 21*a* and 21*b* are formed simultaneously in the frame region F. In the forming the first electrode 21, since end faces of the first frame wiring lines 18*h* and the second frame wiring lines 18*i*, which are exposed from the flattening film 19, the first dam wall NW, and the second resin layer 19*b* constituting the second dam wall Wb, are covered with the conductive layer 21*a* and the conductive layer 21*b* (see FIG. 8), for example, the end faces of the first frame wiring lines 18*h* and the second frame wiring line 18*i*, which are each constituted of a layered film of the titanium film 6, the aluminum film 7, and the titanium film 8, are less susceptible to damage from the etching solution used in forming the first electrode 21. Note that when the conductive layer 21*a* and the conductive layer 21*b* are not formed, the aluminum film 7 is susceptible to damage from the etching solution, such that a side face Ea of the aluminum film 7 is easily retracted as represented by a two-dot chain line Eb in FIG. 8, and the edges of the first frame wiring lines 18*h* and the second frame wiring lines 18i are easily formed in an overhanging shape. When forming the edge cover 22, in the frame region F, the upper layer (third resin layer 22a) of the second dam wall Wb is formed simultaneously. Also in the forming the edge cover 22, as in the forming the first electrode 21, since end faces of the first frame wiring lines 18h and the second frame wiring lines 18i, which are exposed from the flattening film 19, the first dam wall Wa, and the second resin layer 19b constituting the second dam wall Wb, are covered with the conductive layer 21a and the conductive layer 21b (see FIG. 8), for example, the end faces of the first frame wiring lines 18h and the second frame wiring lines 18i, which are each constituted of a layered film of the titanium film 6, the aluminum film 7, and the titanium film 8, are less susceptible to damage from the etching solution used in forming the first electrode 21. Note that when the conductive layer 21a and the conductive layer 21b are not formed, the aluminum film 7 is susceptible to damage from the etching solution, such that a side face Ea of the aluminum film 7 is easily retracted as represented by a two-dot chain line Eb in FIG. 8, and the edges of the first frame wiring lines 18h and the second frame wiring lines 18i are easily formed in an overhanging shape.

Forming Sealing Film

First, using a mask, an inorganic insulating film such as a silicon nitride film, a silicon oxide film, or a silicon oxynitride film is film-formed on the surface of the substrate on which the organic EL element 25 is formed in the forming organic EL element so as to have a thickness of about 1000 nm by the plasma CVD method, to form the first inorganic film 26.

Next, an organic resin material such as acrylic resin is film-formed on the surface of the substrate on which the first inorganic film 26 is formed, for example, by an ink-jet method, so as to have a thickness of about 10 μm, to form the organic film 27.

Furthermore, using a mask, an inorganic insulating film such as a silicon nitride film, a silicon oxide film, or a silicon oxynitride film is film-formed on the surface of the substrate on which the organic film 27 is formed so as to have a thickness of about 500 nm by the plasma CVD method, to form the second inorganic film 28, thereby forming the sealing film 30.

Finally, by applying a protective sheet (not illustrated) to the surface of the substrate on which the sealing film 30 is formed, and irradiating the surface with laser light from the side of the glass substrate of the resin substrate layer 10, the glass substrate is peeled from the lower face of the resin substrate layer 10, and a protective sheet (not illustrated) is applied to the lower face of the resin substrate layer 10 from which the glass substrate is peeled.

In this manner, the organic EL display device 50a of the present embodiment can be manufactured.

As described above, in the organic EL display device 50a of the present embodiment, the conductive layer 21a and the conductive layer 21b are provided to cover the end faces of the first frame wiring lines 18h and the second frame wiring lines 18i, which are exposed from the first slit Sa, the second slit Sb, and the third slit Sc. Thus, in forming the first electrode 21, the end faces of the first frame wiring lines 18h and the second frame wiring lines 18i are less susceptible to damage from the etching solution used in forming the first electrode 21. Also in forming the edge cover 22, the end faces of the first frame wiring lines 18h and the second frame wiring lines 18i are less susceptible to damage from the developing solution that develops a photosensitive resin precursor that becomes the edge cover 22. Accordingly, in forming the first electrode 21 and forming the edge cover 22, the end faces of the first frame wiring lines 18h and the second frame wiring lines 18i are less susceptible to damage, and damage received during the manufacturing processes of first frame wiring line 18h and the second frame wiring line 18i can be suppressed.

In the organic EL display device 50a of the present embodiment, since the end faces of the first frame wiring line 18h and the second frame wiring lines 18i formed of a layered films of the titanium film 6, the aluminum film 7, and the titanium film 8 are less susceptible to damage, the edges of the cross-sectional shape of the first frame wiring line 18h and the second frame wiring lines 18i is less likely to be formed in an overhanging shape. Accordingly, the sealing performance of the sealing film 30 that covers the first frame wiring line 18h and the second frame wiring lines 18i can be ensured, suppressing deterioration of the organic EL element 25.

Second Embodiment

Figure 9:
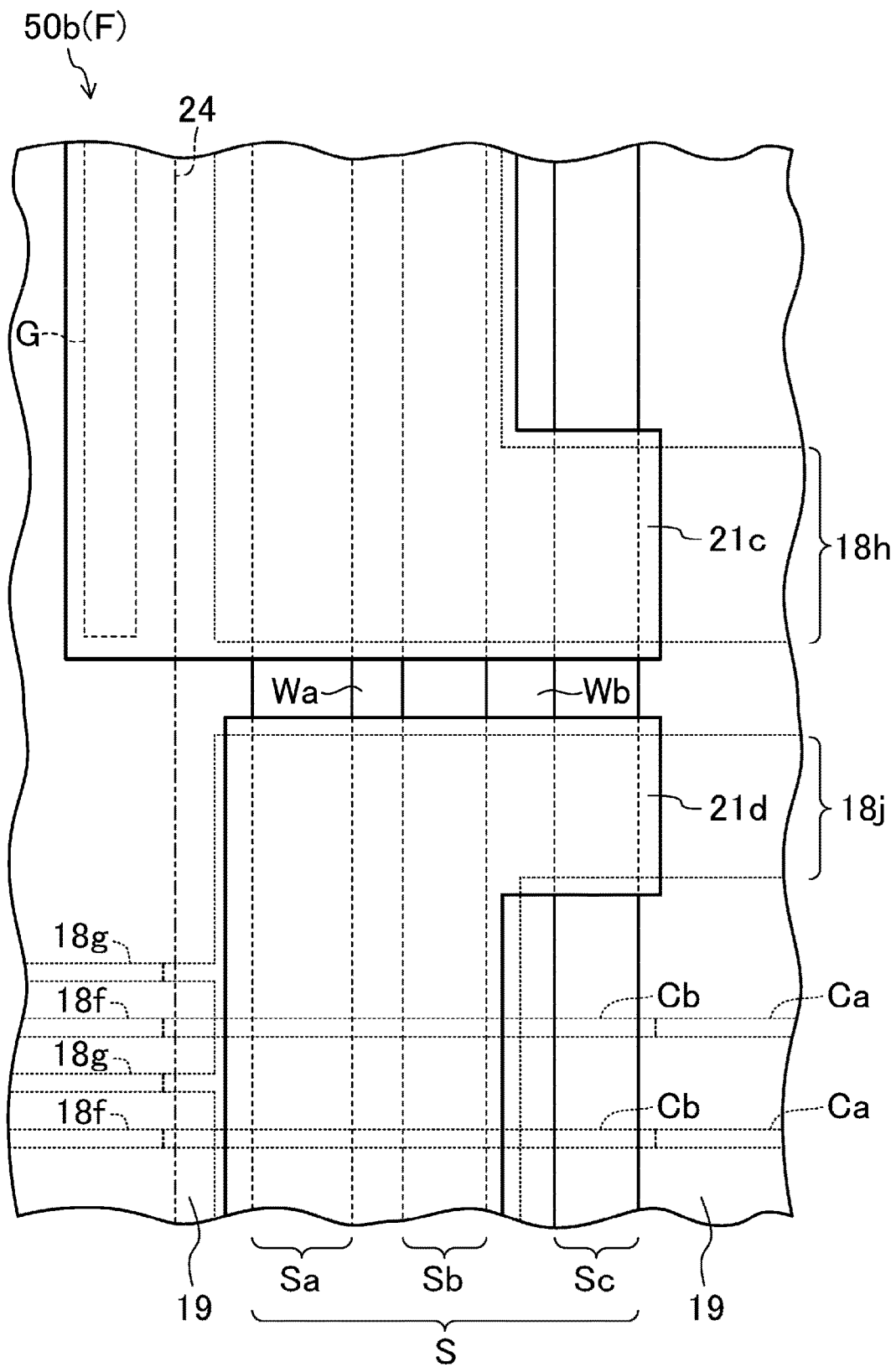
FIG. 9 is a plan view of the enlarged main portion of frame region of the organic EL display device according to a second embodiment of the disclosure, and corresponds to FIG. 6.

FIG. 9 illustrates a second embodiment of the display device according to the disclosure. Here, FIG. 9 is a plan view of the enlarged main portion of frame region F of the organic EL display device 50b of the present embodiment, and corresponds to FIG. 6. Note that, in the following embodiments, portions identical to those in FIGS. 1 to 8 are denoted by the same reference signs, and their detailed descriptions are omitted.

In the first embodiment, an organic EL display device 50a is exemplified in which the conductive layers 21a and 21b are provided to cover the end faces of the frame wiring lines exposed from the slits S, that is, the first frame wiring lines 18h and the second frame wiring lines 18i, but in the present embodiment, an organic EL display device 50b is exemplified in which conductive layers 21c and 21d are provided to cover the entire faces of the frame wiring lines exposed from the slit S, that is, the first frame wiring lines 18h and the second frame wiring lines 18j.

The organic EL display device 50b, like the organic EL display device 50a of the first embodiment described above, includes a display region D and a frame region F provided in the periphery of the display region D.

Similar to the organic EL display device 50a of the first embodiment described above, the organic EL display device 50b includes a resin substrate layer 10, a TFT layer 20 provided on the resin substrate layer 10, an organic EL element 25 provided on the TFT layer 20, and a sealing film 30 provided to cover the organic EL element 25 in the display region D.

Similar to the organic EL display device 50a of the first embodiment, the organic EL display device 50b includes, in the frame region F, the resin substrate layer 10, an inorganic insulating layered film M provided on the resin substrate layer 10, and the first frame wiring lines 18h and second frame wiring lines 18j provided on the inorganic insulating layered film M, a flattening film 19 provided on the first frame wiring lines 18h and the second frame wiring lines 18j, a first dam wall Wa, a second dam wall Wb, and a sealing film 30 provided to cover the flattening film 19, the first dam wall Wa, and the second dam wall Wb.

Similar to the second frame wiring lines 18i of the first embodiment, a pair of the second frame wiring lines 18j are provided such that one edges reach both ends of the terminal portion T. Each of the second frame wiring lines 18j receives an input of a high power supply voltage, and the other end thereof is drawn wide along the first slit Sa and the second slit Sb as illustrated in FIG. 9, protrudes toward the display region D, and is electrically connected to the plurality of power source lines 18g disposed in the display region D. In other words, unlike the second frame wiring line 18i of the first embodiment, the second frame wiring line 18j itself branches into a plurality of branches on the side of the display region D to constitute a high power supply voltage trunk wiring line. As in the first embodiment, the high power supply voltage trunk wiring line may be provided between the first slit Sa and the display region D. The second frame wiring lines 18j and the source electrode 18a and the like are provided in the same layer and made of the same material. Note that, in the plan view of FIG. 9, the seating film 30 disposed on the entire face of the drawing is omitted. FIG. 9 exemplifies a configuration in which lead wiring line Ca made of the same material and formed in the same layer as those of the source electrode 18a is electrically connected to the source line 18f disposed in the display region D. Here, the lead wiring line Ca is drawn to a lead wiring line Cb made of the same material and formed in the same layer as those of the gate electrode 17a or the upper conductive layer 16 before crossing the slit S. The lead wiring lines Cb is drawn to the source line 18f after crossing the slit S.

As illustrated in FIG. 9, a conductive layer 21c is provided on the first frame wiring lines 18h exposed from the first slit Sa, the second slit Sb, and the third slit Sc, so as to cover the entire surface of the first frame wiring lines 18h. As illustrated in FIG. 9, a conductive layer 21d is provided on the second frame wiring lines 18j exposed from the first slit Sa, the second slit Sb, and the third slit Sc, so as to cover the entire surface of the second frame wiring lines 18j. The conductive layers 21c and 21d, and the first electrode 21 are provided in the same layer and are made of the same material. According to this configuration, the conductive layers 21c and 21d can protect the end faces of the first frame wiring lines 18h and the second frame wiring lines 18j as welt as decrease the wiring resistance of the first frame wiring lines 18h and the second frame wiring lines 18j.

Similar to the organic EL display device 50a of the first embodiment, the organic EL display device 50b described above is flexible and configured to display an image by causing a light-emitting layer body 3 of the organic EL layer 23 to emit tight as required via the first TFT 9a and the second TFT 9b in each subpixel P.

The organic EL display device 50b of the second embodiment can be manufactured by modifying the planar shape of the second frame wiring lines 18i and the conductive layers 21a and 21b in the method for manufacturing the organic EL display device 50a described in the first embodiment.

As described above, in the organic EL display device 50b of the present embodiment, the conductive layer 21c and the conductive layer 21d are provided to cover the entire faces of the first frame wiring lines 18h and the second frame wiring lines 18j which are exposed from the first slit Sa, the second slit Sb, and the third slit Sc. Thus, in the forming the first electrode 21, the end faces of the first frame wiring lines 18h and the second frame wiring lines 18j are less susceptible to damage from the etching solution used in forming the first electrode 21. Also in forming the edge cover 22, the end faces of the first frame wiring lines 18h and the second frame wiring lines 18j are less susceptible to damage from the developing solution that develops a photosensitive resin precursor that becomes the edge cover 22. Accordingly, in forming the first electrode 21 and forming the edge cover 22, the end faces of the first frame wiring lines 18h and the second frame wiring lines 18j are less susceptible to damage, and damage received during the manufacturing processes of first frame wiring line 18h and the second frame wiring line 18j can be suppressed.

In the organic EL display device 50b of the present embodiment, since the end faces of the first frame wiring lines 18h and the second frame wiring lines 18j formed of a layered films of the titanium film 6, the aluminum film 7, and the titanium film 8 are less susceptible to damage, the edges of the cross-sectional shape of the first frame wiring lines 18h and the second frame wiring lines 18j is less likely to be formed in an overhanging shape. Accordingly, the sealing performance of the sealing film 30 that covers the first frame wiring line 18h and the second frame wiring line 18j can be ensured, suppressing deterioration of the organic EL element 25.

Note that in the present embodiment, damage on not only the end faces of the first frame wiring lines 18h and the second frame wiring lines 18j but also the surface can be suppressed, and for example, it also be applied to a wiring line formed by sequentially laminating a titanium film and a copper film from a lower layer. In the wiring line, a high melting-point metal film made of molybdenum, tantalum, tungsten, or the like may be used instead of the titanium film.

Other Embodiments

Figure 10:
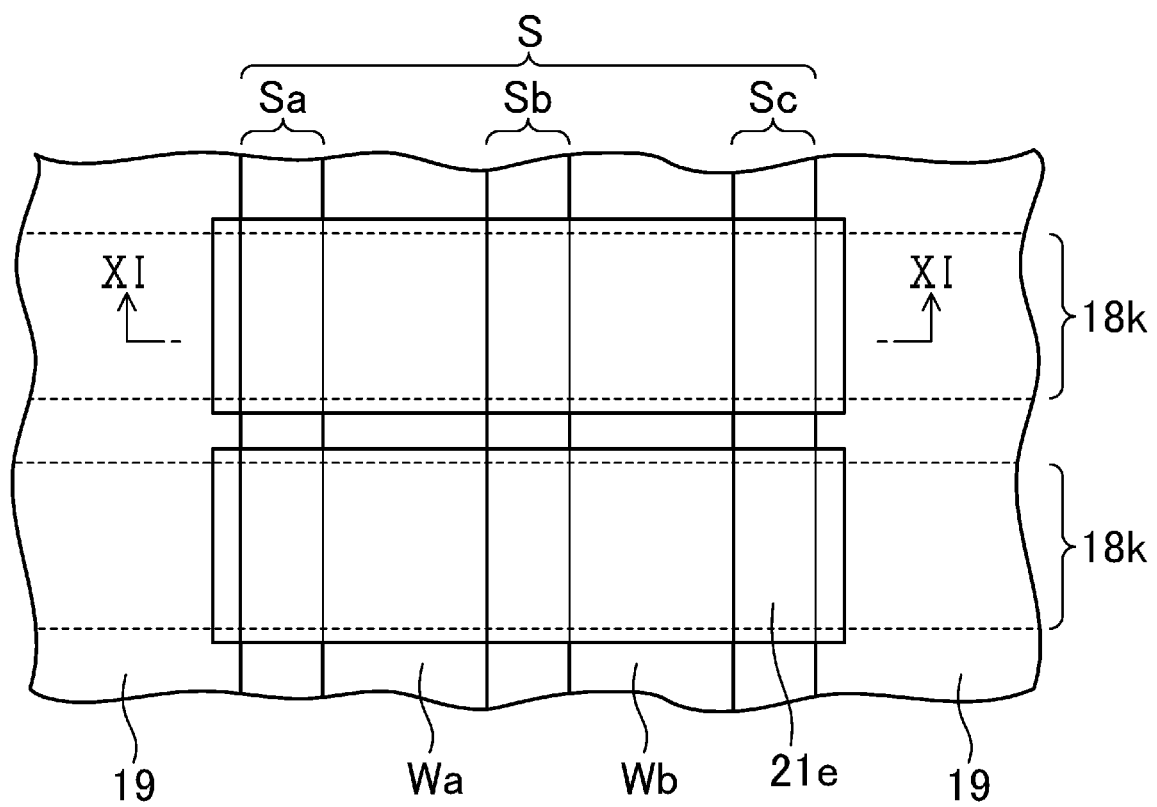
FIG. 10 is a plan view of the enlarged main portion of frame region of an organic EL display device according to another embodiment of the disclosure.
Figure 11:
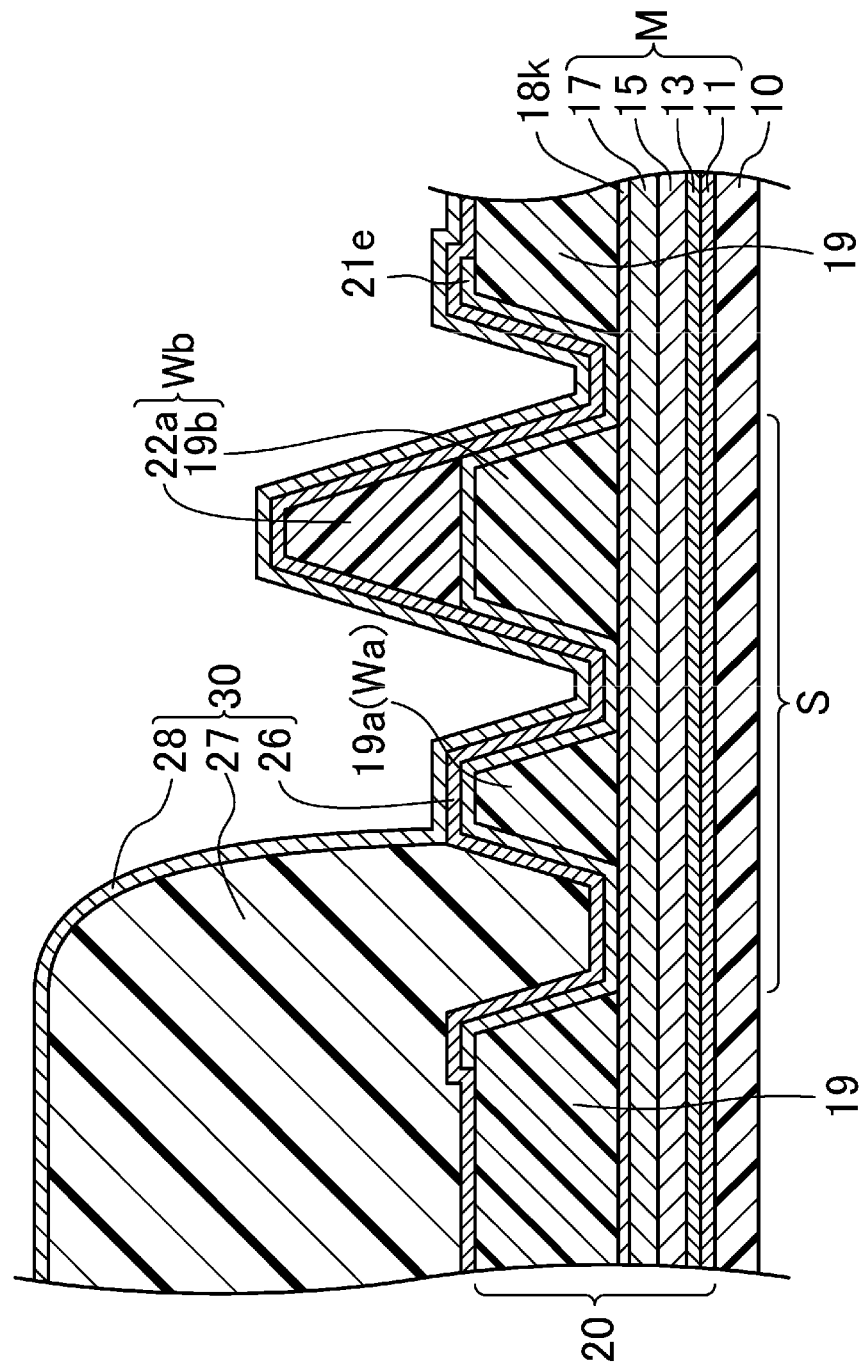
FIG. 11 is a cross-sectional view of the frame region of the organic EL display device taken along a line XI-XI in FIG. 10.

In the first embodiment described above, configuration in which the lead wiring lines C made of the same material and formed in the same layer as those of the gate electrode 14a, the upper conductive layer 16, or the source electrode 18a are provided as other frame wiring lines between the pair of second frame wiring lines 18i is exemplified. However, in the region where the slit S is formed, as illustrated in FIG. 10, a third frame wiring line 18k made of the same material and formed in the same layer as those of the source electrode 18a and the like may be provided as the frame wiring line between the pair of second frame wiring lines 18i. FIG. 10 is a plan view of the enlarged main portion of frame region F of an organic EL display device according to the present embodiment. FIG. 11 is a cross-sectional view of the frame region F of the organic EL display device taken along a line XI-XI in FIG. 10.

Specifically, in the region where the slit S is formed, as illustrated in FIG. 10, a plurality of the third frame wiring lines 18k made of the same material and formed in the same layer as those of the source electrode 18a and the like are provided between the pair of second frame wiring lines 18i so as to extend parallel to each other in a direction orthogonal to the direction in which the terminal portion T extends (the lateral direction in FIG. 1). In this case, as illustrated in FIG. 10 and FIG. 11, the conductive layer 21e is provided on the third frame wiring line 18k exposed from the first slit Sa, the second slit Sb, and the third slit Sc, so as to cover the entire face of the third frame wiring line 18k. The third frame wiring line 18k receives an input of a data signal voltage, for example, and is electrically connected to a plurality of source lines 18f disposed in the display region D. Here, the width of the third frame wiring line 18k is narrower than the width of the first frame wiring line 18h and the second frame wiring line 18i through which more current flows. Furthermore, in order to correspond to the source line 18f, the number of the third frame wiring lines 18k is large, and the distance between the third frame wiring lines 18k is smaller than the distance between the first frame wiring lines 18h and the distance between the second frame wiring lines 18i. Therefore, as illustrated in FIG. 10, the conductive layer 21e is provided to cover the entire face of the third frame wiring line 18k, but when the distance between the wiring lines can be increased, as in the first embodiment, the conductive layer 21e may be provided to cover the end face of the third frame wiring line 18k. The conductive layer 21e and the first electrode 21 are provided in the same layer and are made of the same material. In the plan view of FIG. 10, the sealing film 30 disposed on the entire face of the drawing is omitted.

In each of the above-described embodiments, the organic EL layer has the five-layered structure including the hole injection layer, the hole transport layer, the light-emitting layer, the electron transport layer, and the electron injection layer is exemplified. However, for example, the organic EL layer may have a three-layered structure including a hole injection layer also serves as the hole transport layer, the light-emitting layer, the electron transport layer also serves as the electron injection layer.

In each of the embodiments described above, the organic EL display device including the first electrode as an anode and the second electrode as a cathode is exemplified. The disclosure is also applicable to an organic EL display device, in which the layers of the structure of the organic EL layer are in the reverse order, with the first electrode being a cathode and the second electrode being an anode.

In each of the above-described embodiments, the organic EL display devices is exemplified in which the TFT electrode coupled to the first electrode serves as the drain electrode. However, the disclosure can be also applied to an organic EL display device in which the TFT electrode coupled to the first electrode is referred to as the source electrode.

Although the foregoing embodiments describe the organic EL display devices as examples of display devices, the disclosure can be also applied to display devices including a plurality of light-emitting elements driven by an electrical current. For example, the disclosure is applicable to display devices including quantum dot light-emitting diodes (QLEDs), which are light-emitting elements using a quantum dot-containing layer.

INDUSTRIAL APPLICABILITY

As described above, the disclosure is useful for a flexible display device.

The invention claimed is:

1. A display device comprising:
a base substrate;
a thin-film transistor (TFT) layer provided on the base substrate;
a light-emitting element provided on the TFT layer, the light-emitting element being in a display region of the display device;
a frame region provided in a periphery of the display region;
a terminal portion provided at an edge of the frame region extending in one direction;
a frame wiring line in the TFT layer, the frame wiring line being provided in the frame region;
a flattening film in the TFT layer, the flattening film being provided in the display region and the frame region, and the flattening film defining a frame-shaped slit in the frame region;
a plurality of first electrodes in the light-emitting element, the plurality of first electrodes being provided on the flattening film;
a second electrode in the light-emitting element, the plurality of first electrodes being between the second electrode and the flattening film, the second electrode interposing a light-emitting layer; and
a conductive layer covering at least an end face of the frame wiring line that is exposed from the frame-shaped slit, the conductive layer and the plurality of first electrode being in a same layer and made of a same material, wherein:
the frame wiring line includes multiple first frame wiring lines,
the first frame wiring line is configured to receives an input of a power supply voltage, and electrically connected to the second electrode,
a pair of the multiple first frame wiring lines respectively reaches either edges of the terminal portion,
the frame wiring line further includes at least one second frame wiring line, and
the at least one second frame wiring line is configured to receive an input of a power supply voltage that has a higher voltage than the power supply voltage received by the first frame wiring, and is electrically connected to a plurality of power source lines disposed in the display region.

2. The display device according to claim 1, the frame wiring line includes a pair of the second frame wiring lines, each of the pair of the second frame wiring lines reaches a respective edge of the terminal portion.

3. The display device according to claim 1, wherein the at least one second frame wiring line is a high power supply voltage trunk wiring line, and the high power supply voltage trunk wiring line branches into a plurality of branches toward the display region, and the plurality of branches is electrically connected to the plurality of power source lines disposed in the display region.

4. The display device according to claim 3, further comprising:
a plurality of lead wiring lines configured to input a data signal voltage to a plurality of source lines disposed in the display region, the plurality of lead wiring lines crossing the frame-shaped slit,
wherein the lead wiring lines are electrically isolated from the high power supply voltage trunk wiring line and are provided closer to the base substrate than to the high power supply voltage trunk wiring line.

5. The display device according to claim 1, wherein the frame wiring line further includes a third frame wiring line, and
the third frame wiring line is configured to receive an input of a data signal voltage, and is electrically connected to a plurality of source lines disposed in the display region.

6. The display device according to claim 1, wherein the conductive layer covers an entire surface of the frame wiring line exposed from the frame-shaped slit.

7. The display device according to claim 1, wherein the frame wiring line is made from at least two layers of metal layered films.

8. The display device according to claim 7, wherein the at least two layers of metal films comprises a titanium film, an aluminum film, and a titanium film layered in such order.

9. The display device according to claim 1, further comprising a sealing film, the sealing film covering the light-emitting element, and comprising a first inorganic film, an organic film, and a second inorganic film layered in such order, wherein the conductive layer is in contact with the first inorganic film in an area where the frame-shaped slit is defined in the frame region.

10. The display device according to claim 1, further comprising:
    a first dam wall, the first dam wall being frame shaped and provided at a display side of a region wherein the frame-shaped slit is defined; and
    a second dam wall, the second dam wall being frame shaped and surrounding the first dam wall in the region where the frame-shaped slit is defined,
    wherein the frame-shaped slit includes a first slit disposed between the flattening film at the display side and the first dam wall, a second slit disposed between the first dam wall and the second dam wall, and a third slit disposed between the flattening film at a side opposite to the display side and the second dam wall.

11. The display device according to claim 1,
    wherein the light-emitting element is an organic electroluminescent (EL) element.

* * * * *